United States Patent
Cheng et al.

(10) Patent No.: US 7,220,630 B2
(45) Date of Patent: May 22, 2007

(54) METHOD FOR SELECTIVELY FORMING STRAINED ETCH STOP LAYERS TO IMPROVE FET CHARGE CARRIER MOBILITY

(75) Inventors: Kaun-Lun Cheng, Hsinchu (TW); Shui-Ming Cheng, Hsinchu (TW); Yu-Yuan Yao, Singang Village, Changhau County (TW); Ka-Hing Fung, Hsinchu (TW); Sun-Jay Chang, Luye Township, Tai-Tung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 112 days.

(21) Appl. No.: 10/851,377

(22) Filed: May 21, 2004

(65) Prior Publication Data

US 2005/0260810 A1  Nov. 24, 2005

(51) Int. Cl.
*H01L 21/8238* (2006.01)
(52) U.S. Cl. .................. 438/199; 438/738; 438/757; 438/786; 438/791

(58) Field of Classification Search ............ 438/199, 438/738, 757, 791, 786
See application file for complete search history.

(56) References Cited

U.S. PATENT DOCUMENTS

| 6,573,172 | B1 * | 6/2003 | En et al. .................... 438/626 |
| 2003/0040158 | A1 * | 2/2003 | Saitoh ........................ 438/279 |
| 2003/0181005 | A1 * | 9/2003 | Hachimine et al. ......... 438/231 |
| 2004/0029323 | A1 * | 2/2004 | Shimizu et al. ............. 438/142 |
| 2005/0214998 | A1 * | 9/2005 | Chen et al. ................. 438/199 |

\* cited by examiner

*Primary Examiner*—Zandra V. Smith
*Assistant Examiner*—Toniae M. Thomas
(74) *Attorney, Agent, or Firm*—Tung & Associates

(57) ABSTRACT

A strained channel MOSFET device with improved charge carrier mobility and method for forming the same, the method including providing a first and second FET device having a respective first polarity and second polarity opposite the first polarity on a substrate; forming a strained layer having a stress selected from the group consisting of compressive and tensile on the first and second FET devices; and, removing a thickness portion of the strained layer over one of the first and second FET devices to improve charge carrier mobility.

36 Claims, 3 Drawing Sheets

METHOD FOR SELECTIVELY FORMING STRAINED ETCH STOP LAYERS TO IMPROVE FET CHARGE CARRIER MOBILITY

FIELD OF THE INVENTION

This invention generally relates to formation of MOSFET devices in integrated circuit manufacturing processes and more particularly to a method of selectively forming stressed (strained) contact etch stop layers over a MOSFET device to improve both electron and hole charge carrier mobility in respective NMOS and PMOS FET channel regions.

BACKGROUND OF THE INVENTION

Mechanical stresses are known to play a role in charge carrier mobility which affects Voltage threshold shifts. The effect of mechanical stresses to induce a strain on an FET channel region and thereby influence charge carrier mobility is believed to be due to complex physical processes related to acoustic and optical phonon scattering.

Generally, manufacturing processes are known to introduce strain into the MOSFET device channel region. For example, some strain (stress) is typically introduced into the channel region by formation of an overlying polysilicon gate structure and silicide formation processes. In addition, ion implantation and annealing processes following formation of the gate structure typically introduce additional stresses into the polysilicon gate structure which translate a strain into the underlying channel region altering device performance.

Prior art processes have attempted to introduce offsetting stresses into the channel region by forming stressed dielectric layers over the polysilicon gate structure following a silicide formation process. These approaches have met with limited success, however, since the formation of the stressed dielectric layer of a particular type of stress e.g., tensile or compressive, has a degrading electrical performance effect on a CMOS device formed to operate with an opposite type of majority charge carrier (e.g., NMOS vs. PMOS). For example, as NMOS device performance is improved, PNMOS device performance is degraded.

Other shortcomings in prior art approaches are the adverse affect of the dielectric stressed layers on subsequent gap filling ability of a subsequent inter-layer dielectric (ILD) layer deposition. For example, the thickness of the dielectric stress layer, and therefore the stress altering influence, is limited due to the formation of narrower gaps between devices, a limitation that will increase as device sizes and gap sizes between devices decreases. For example, increasing the dielectric layer stressed layer thickness over one device to increase a stress to improve a charge carrier mobility has the offsetting effect of degrading an opposite polarity FET device performance including drain current ($I_{dsat}$).

These and other shortcomings demonstrate a need in the semiconductor device integrated circuit manufacturing art for improved strained channel FET devices and methods for forming the same to selectively control an induced stress type and level to improve both NMOS and PMOS device performance and reliability.

It is therefore an object of the present invention to provide improved strained channel FET devices and methods for forming the same to selectively control an induced stress type and level to improve both NMOS and PMOS device performance and reliability, in addition to overcoming other shortcomings in the prior art.

SUMMARY OF THE INVENTION

To achieve the foregoing and other objects, and in accordance with the purposes of the present invention, as embodied and broadly described herein, the present invention provides a strained channel MOSFET device with improved charge carrier mobility and method for forming the same.

In a first embodiment, the method includes providing a first and second FET device having a respective first polarity and second polarity opposite the first polarity on a substrate; forming a strained layer having a stress selected from the group consisting of compressive and tensile on the first and second FET devices; and, removing a thickness portion of the strained layer over one of the first and second FET devices to improve charge carrier mobility.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to exemplary NMOS and PMOS MOSFET devices, it will be appreciated that the method of the present invention may be applied to the formation of any MOSFET device where a strain is controllably introduced into a charge carrier channel region by selective formation and subsequent removal of buffer layers and/or stressed dielectric layers overlying the respective NMOS and/or PMOS device regions.

Figure 1A:
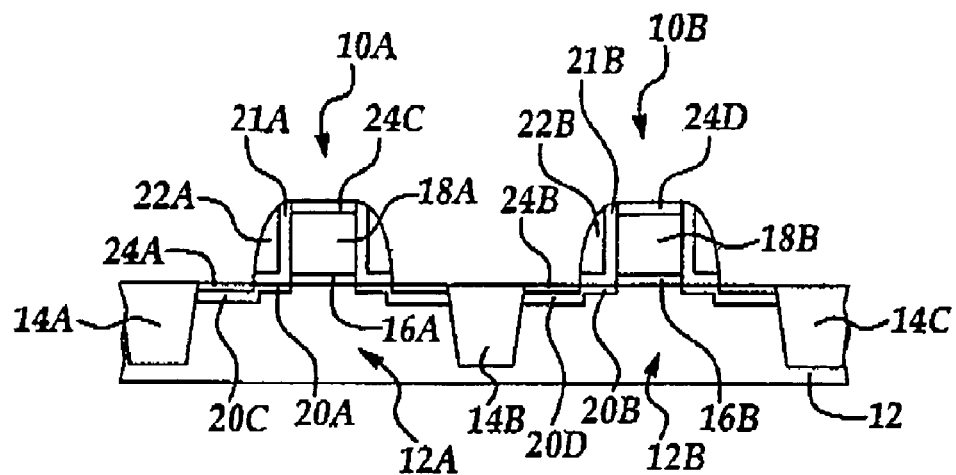
FIGS. 1A–1F are cross sectional schematic representations of exemplary portions of a MOSFET device pair including NMOS and PMOS portions formed at stages of manufacture according to an embodiment of the present invention.

Referring to FIGS. 1A–1F in an exemplary embodiment of the method of the present invention, are shown cross-sectional schematic views of a portion of a semiconductor wafer during stages in production of MOSFET structures including NMOS and PMOS devices 10B and 10A. For example, referring to FIG. 1A, is shown a semiconductor substrate 12, which may include silicon, strained semiconductor, compound semiconductor, and multilayered semiconductors, or combinations thereof. For example, the substrate 12 may include, but is not limited to, silicon on insulator (SOI), stacked SOI (SSOI), stacked SiGe on insulator (S—SiGeoI), SiGeOI, and GeOI, or combinations thereof. For example the substrate may include doped well, regions 12A and 12B making up respective PMOS and NMOS device regions formed by conventional methods, for example a masking process followed by ion implantation and activation annealing. Electrical isolation regions, preferably (STI) structures e.g., 14A, 14B, and 14C, back filled with an oxide dielectric, for example TEOS oxide, are formed by conventional processes prior to forming the doped well regions.

Still referring to FIG. 1A, gate structures are formed by conventional processes including gate dielectric portions e.g., 16A and 16B and overlying gate electrode portions e.g., PMOS device gate electrode 18A and NMOS device gate electrode 18B. For example, gate dielectric layers and gate electrode layers are deposited by CVD processes followed by photolithographic patterning and plasma assisted etching (e.g., RIE) to form the respective PMOS and NMOS gate structures.

The gate dielectric portions e.g., 16A and 16B may be formed of silicon oxide, silicon oxynitride, silicon nitride, nitrogen doped silicon oxide, high-K dielectrics, or combinations thereof. The high-K dielectrics may include metal oxides, metal silicates, metal nitrides, transition metal-oxides, transition metal silicates, metal aluminates, and transition metal nitrides, or combinations thereof. The gate dielectric portions e.g., 16A and 16B may be formed by any process known in the art, e.g., thermal oxidation, nitridation, sputter deposition, or chemical vapor deposition. The physical thickness of the gate dielectric portions e.g., 16A and 16B may be in the range of 5 to 100 Angstroms. When using a high permittivity (high-K) gate dielectric, the dielectric constant is preferably greater than about 8. The high-K dielectric may be selected from a group comprising aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

The gate electrode portions e.g., 18A and 18B may be formed of polysilicon, polysilicon-germanium, metals, metal silicides, metal nitrides, or conductive metal oxides. In a preferred embodiment, the gate electrodes are formed of polysilicon. Metals and silicides thereof such as titanium, cobalt, nickel, molybdenum, tungsten, tantalum, platinum, and hafnium may be used in an upper portion of the gate electrodes e.g., 18A, 18B to form conductive contact regions.

Following formation of the gate electrodes, source/drain extension (SDE) regions e.g., 20A and 20B on either side of a channel region are formed by a conventional ion implant process adjacent the gate structures to a shallow depth e.g., (30 to 100 nm) beneath the silicon substrate surface according to a low energy ion implantation including forming pocket implant regions (not shown).

Still referring to FIG. 1A, sidewall spacers e.g., 22A and 22B, also referred to as offset spacers, are formed on either side of the gate structures and may include offset liners e.g., 21A, 21B lining the sidewalls of the gate structures by depositing one or more layers of silicon nitride (e.g., $Si_3N_4$), silicon oxynitride (e.g., SiON), and silicon oxide (e.g., $SiO_2$) e.g., to form oxide/nitride layers followed by etching away portions of the one or more layers to form self-aligned sidewall spacers and liners on either side of the gate structures.

Following sidewall spacer formation, the NMOS and PMOS device areas are sequentially doped according to a conventional high dose ion implantation (HDI) process to form the high density implant portions of doped source/drain (S/D) regions e.g., 20C and 20D in the substrate 12 adjacent the sidewall spacers. The gate electrodes 18A and 18B may be doped at the same time the HDI is carried out to lower a sheet resistance of the gate electrode material.

Still referring to FIG. 1A, silicide portions e.g., 24A, 24B, 24C, and 24D are optionally formed overlying the source and drain regions and the upper portion of the gate electrodes e.g., 18A and 18B. The silicide portions may be formed of $TiSi_2$, $CoSi_2$, and NiSi, PtSi or $WSi_2$ or combinations thereof by known processes.

Figure 1B:
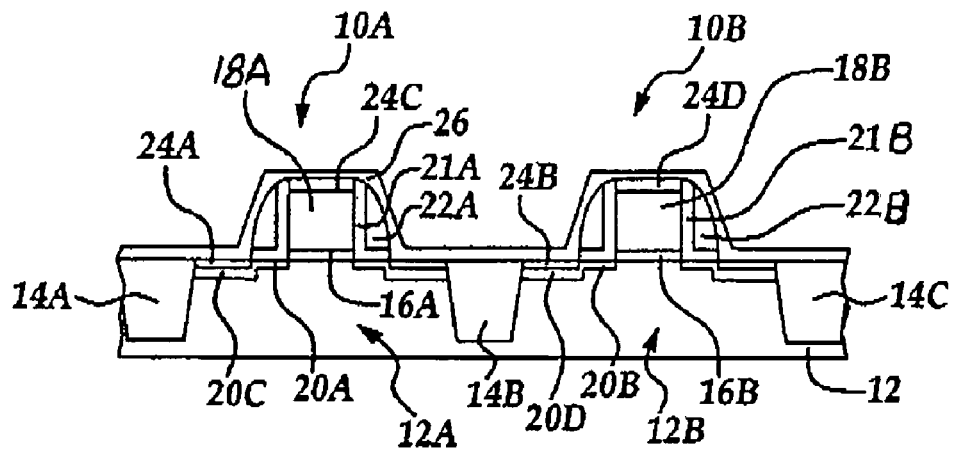

Referring to FIG. 1B, according to an important aspect of the invention, a buffer oxide layer e.g., 26, for example PECVD, or LPCVD oxide, e.g., TEOS oxide, having a thickness of from about 10 Angstroms to about 1000 Angstroms, more preferably less than about 200 Angstroms is formed to overlie both the NMOS and PMOS device regions.

Figure 1C:
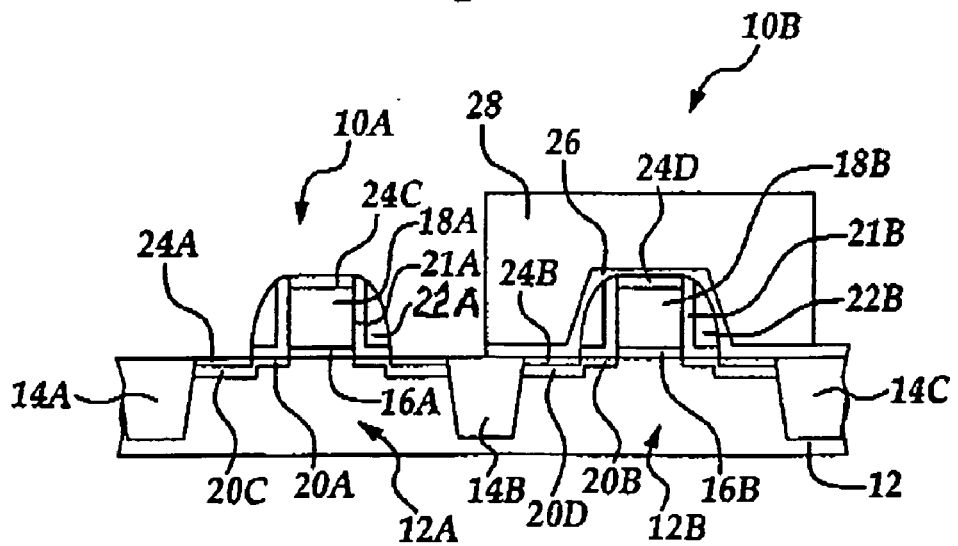

Referring to FIG. 1C, following formation of the buffer oxide layer e.g., 26, a resist patterning process is carried out to form resist portion 28 covering the PHOS region 12A, including about half of the STI structure 14B. A conventional wet and/or dry etching process is then carried out to remove the oxide buffer layer 26 portion overlying the uncovered PMOS region 12B.

Figure 1D:
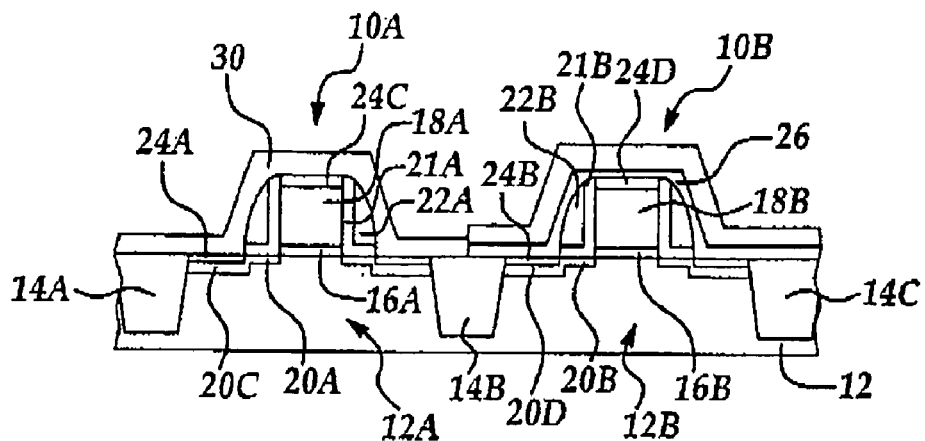

Referring to FIG. 1D, following removal of buffer oxide layer e.g., 26, and removal of the photoresist portion 28, in an important aspect of the invention, a stressed dielectric layer 30, preferably a compressively stressed nitride in the embodiment shown, is blanket deposited over both the NMOS and PMOS regions to form an oxide/nitride bilayer over the NMOS region 12B and a nitride layer over the PMOS device region. It will be appreciated that the term 'nitride' includes silicon nitride and/or silicon oxynitride.

For example, it has been found that a compressively stressed dielectric layer deposited directly over an NMOS device region substrate degrades electron mobility, while a compressively stressed dielectric layer deposited directly on a PMOS device regions (without intervening layers, e.g., buffer layers) enhances hole mobility. Thus, by retaining the buffer oxide layer 26 over the NMOS device region and removing the buffer oxide layer over the PMOS device region, a subsequently deposited compressively stressed dielectric layer e.g., 30 both enhances hole mobility as well as avoids degrading electron mobility, thereby simultaneously improving NMOS and PMOS device performance including a drain current ($I_{dsat}$) at a given applied Voltage. In addition, as shown below in another embodiment, the degrading effect of a compressive stress dielectric layer over an NMOS device or a tensile stress dielectric layer over a PMOS device may be further, or alternatively minimized, by selectively thinning the stressed dielectric layer e.g., 30 over a respectively charge carrier mobility degraded device e.g., thinning a tensile stress layer over a PMOS device region and thinning a compressive stress layer over a NMOS device region.

In the exemplary embodiment as shown, the stressed dielectric layer 30 is preferably a compressive stress nitride film, for example silicon nitride (e.g., SiN, $Si_xN_y$) and/or silicon oxynitride (e.g., $Si_xON_y$), more preferably silicon nitride, where the stoichiometric proportions x and y may be selected according to CVD process variables as are known in the art to achieve a desired stress in a deposited dielectric layer. Preferably the stressed dielectric layer 30 is formed by a CVD process for example, a low pressure chemical vapor deposition (LPCVD) process, an atomic layer CVD (AL-CVD) process, or a plasma enhanced CVD (PECVD) process.

It will be appreciated that the level of stress can be varied by a number of factors including the thickness of the dielectric film, preferably being from about 50 Angstroms to about 1000 Angstroms in thickness. In addition, the relative reactant flow rates, deposition pressure, and temperature may be varied to vary a composition of the dielectric layer thereby controlling the level of stress. Preferably, the stressed dielectric layer 30 is deposited to a stress level of between about 200 MPa and about 2 GPa.

Conventional CVD precursors such as, silane ($SiH_4$), disilane ($Si_2H_6$) dichlorosilane ($SiH_2Cl_2$), hexacholorodisilane ($Si_2Cl_6$), BTBAS and the like, may be advantageously used in the CVD process to form the stressed nitride dielectric layer 30. For example, a low temperature PECVD process for forming a compressive stress nitride layer may include supplying silane ($SiH_4$) and $NH_3$ gaseous precursors at a deposition temperature of from about 300° C. to about 700° C. carried out at pressures of from about 50 mTorr to about 5 Torr and RF powers of from about 100 Watts to about 3000 Watts. The RF power frequency is from about 50 KHz to about 13.56 MHz. It will be appreciated that compressive stress increases with increasing power and frequency of the RF power source.

Figure 1E:
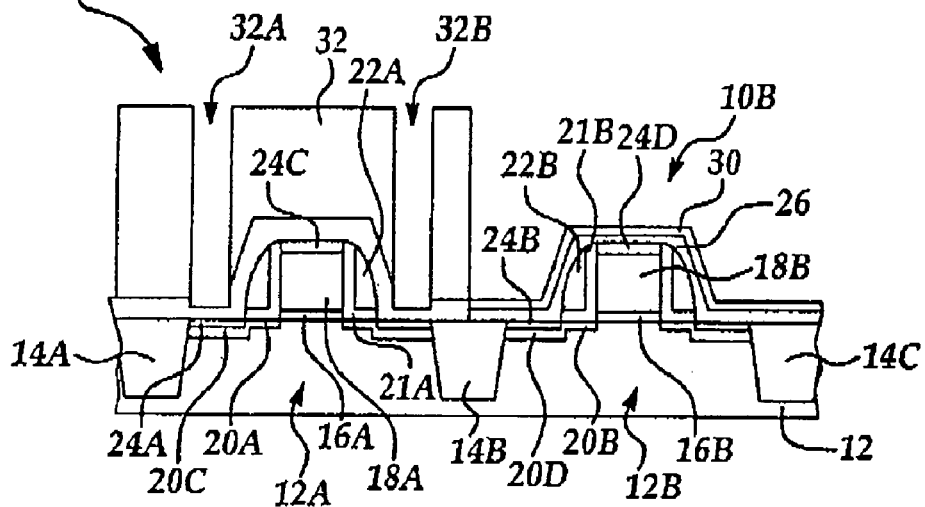

Referring to FIG. 1E, in another embodiment, the stressed dielectric layer 30 is selectively thinned over the NMOS device region following stressed dielectric layer formation. For example, a resist patterning process is carried out to form patterned resist portions e.g., 32 covering PMOS device region 12A portions including forming resist patterned openings e.g., 32A, 32B over the respective PMOS source and drain contact regions e.g., silicide portions 24A, while leaving the NMOS device region 12B uncovered. A conventional dry nitride etching process is then carried out to thin the exposed stressed nitride layer portions 30, preferably by at least about 10 percent of the thickness of the nitride layer to reduce a stress level. For example, the stressed nitride layer is deposited having a thickness of from about 10 Angstroms to about 1000 Angstroms, more preferably less than about 300 Angstroms. Thinning the stressed nitride layer 30 over the NMOS device reduces the level of compressive stress thereby further avoiding the electron carrier mobility degradation caused by the compressively stressed nitride layer on the NMOS channel region. Advantageously, the enhancement in hole mobility in the PMOS channel region is not affected as the compressive stress level remains about the same.

It will be appreciated that the stressed dielectric layer 30, may be formed in tensile stress with the respective process steps shown in FIGS. 1A through 1E carried out with respect to devices of opposite polarity. For example, the stressed dielectric layer thinning process for a tensile stress dielectric layer formed over a PMOS device may be carried out to avoid degradation of hole charge carrier mobility. For example, a tensile stress dielectric layer (e.g., 30) may be formed over the respective NMOS and PMOS devices with or without first forming an underlying oxide buffer layer 26 and which may or may not be removed over the NMOS device region prior to forming a tensile stress dielectric layer over both the NMOS and PMOS devices. It will be appreciated that in this embodiment, with reversed device polarity and stress type of the stressed dielectric layer (e.g., tensile), that the oxide buffer layer 26 need not be formed and removed over the NMOS device 12B. Alternatively, the oxide buffer layer 26 may be formed over the PMOS device but not removed prior to forming a tensile stress dielectric layer over both the NMOS and PMOS devices followed by the thinning process.

Figure 1F:
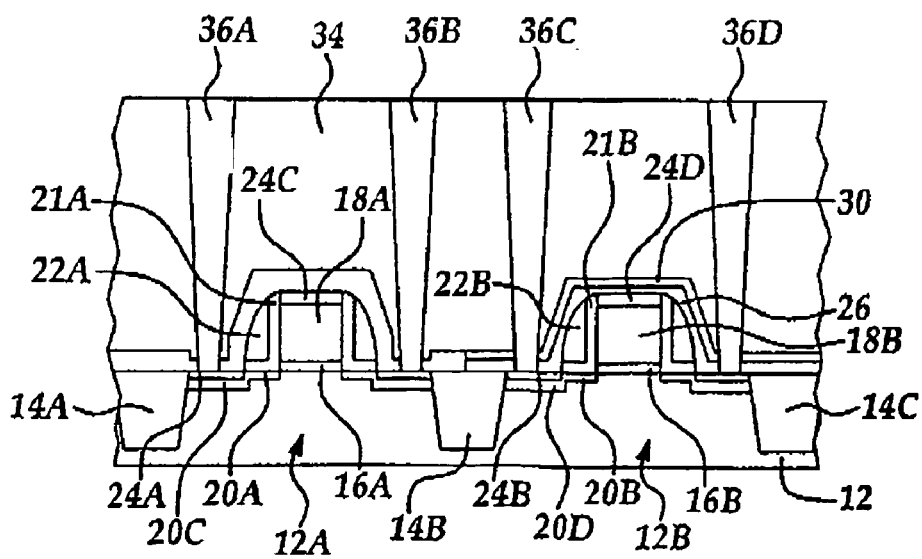

Referring to FIG. 1F, following thinning of the stressed dielectric layer 30, conventional subsequent processes are carried out to form integrated circuit wiring. For example, an overlying inter-layer dielectric (ILD) layer e.g., 34, is formed by depositing a conventional oxide e.g., PECVD oxide, PETEOS, BPTEOS, BTEOS, PTEOS, TEOS, PEOX, low-K (K<2.9) dielectrics, and fluorinated silicate glass (e.g., FSG), or PSG, followed by a planarization step and conventional photolithographic patterning and etching process to form metal filled damascene contacts e.g., 36A, 36B, 36C, and 36D, for example tungsten filled damascenes, to form electric contact wiring to the source and drain regions e.g., salicide regions 24A and 24B.

Figure 2:
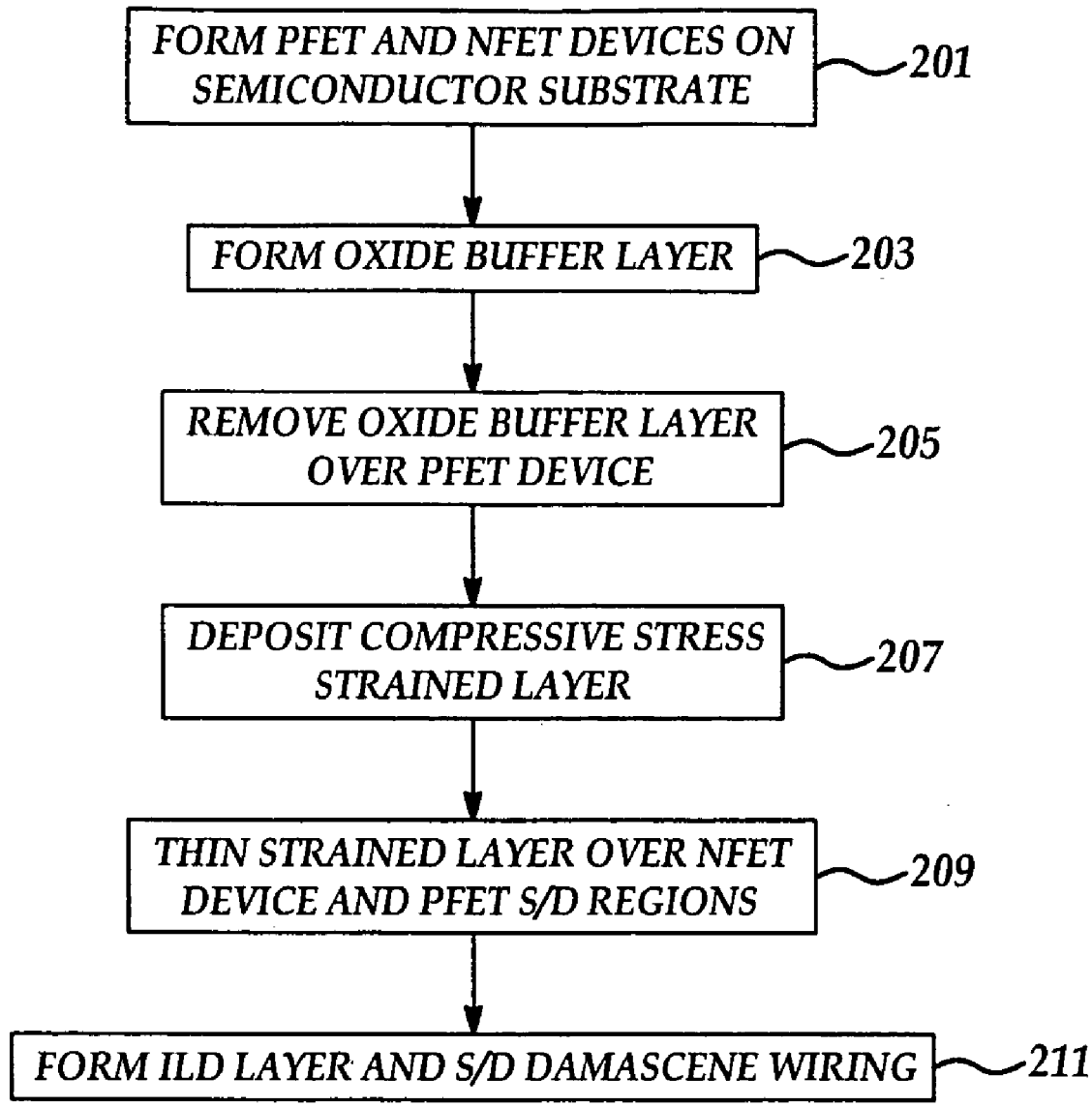
FIG. 2 is an exemplary process flow diagram including several embodiments of the present invention.

Referring to FIG. 2 is a process flow diagram including several embodiments of the present invention. In process 201, a semiconductor substrate including respective PFET and NFET devices and device regions is provided. In process 203 a buffer oxide layer is formed over the respective gate structures and device regions. In process 205, the buffer oxide layer is removed over the PFET device region. In process 207, a strained compressive stress dielectric layer is formed over the respective device regions. In process 209, the strained compressive stress dielectric layer is thinned over the NFET device region and S/D regions of the PFET device. In process 211, an overlying ILD layer is formed and wiring damascene contacts formed to the respective FET device source and drain regions.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for improving charge carrier mobility in a P and N type polarity strained channel MOSFET device pair comprising the steps of:
    providing a first and second FET device having a respective first polarity and second polarity opposite the first polarity on a substrate;
    forming a strained layer having a stress selected from the group consisting of compressive and tensile on the first and second FET devices; and,
    removing a thickness portion of the strained layer over the respective source and drain regions comprising the first and second FET devices to improve charge carrier mobility.

2. The method of claim 1, further comprising the step of forming a buffer oxide layer on the first and second FET devices prior to the step of forming a strained layer.

3. The method of claim 2, further comprising the step of removing the buffer oxide layer on one of the first and second FET devices.

4. The method of claim 3, wherein the buffer oxide layer is removed on the first polarity FET device, said first polarity FET device having P-type polarity.

5. The method of claim 4, wherein the step of forming a strained layer comprises forming said strained layer in compressive stress.

6. The method of claim 1, wherein the step of removing comprises removing said thickness portion of the strained layer formed in compressive stress over the second FET device, said second FET device having N-type polarity.

7. The method of claim 1, wherein the step of removing comprises removing said thickness portion of the strained layer formed in tensile stress over the first FET device, said first FET device having P-type polarity.

8. The method of claim 1, wherein the step of removing comprises removing greater than about 10 percent of said thickness portion of the strained layer.

9. The method of claim 1, further comprising the steps of:
    forming a dielectric insulating layer on the strained layer; and, forming metal damascenes through the dielectric insulating layer to contact the source and drain regions of the respective first and second FET devices.

10. The method of claim 1, wherein the step of removing comprises the steps of:
forming a patterned resist layer exposing an area over said source and drain regions comprising one of the first and second FET devices; and,
dry etching the strained layer to remove the thickness portion.

11. The method of claim 1, wherein the strained layer consists essentially of silicon nitride.

12. The method of claim 1, wherein the strained layer is selected from the group consisting of silicon nitride and silicon oxynitride.

13. The method of claim 1, wherein the strained layer is formed having a stress level up to about 2 GPa.

14. The method of claim 1, wherein the strained layer is formed having a thickness from about 10 Angstroms to about 1000 Angstroms.

15. A method for improving charge carrier mobility in a P and N type conductivity strained channel MOSFET device pair comprising the steps of:
providing a first and second FET device having a respective first and second conductivity type on a substrate;
forming a buffer oxide layer on the first and second FET devices; and
forming a strained layer having primarily one of compressive stress and tensile stress over the first and second FET devices; and,
removing a thickness portion of the strained layer over the respective source and drain regions comprising the first and second FET devices to improve charge carrier mobility.

16. The method of claim 15, wherein the buffer oxide layer is removed over the first FET device prior to the step of forming a strained layer, said first FET device having P-type polarity.

17. The method of claim 16, wherein the strained layer is formed in compressive stress.

18. The method of claim 15, further comprising the step of removing the buffer oxide layer over one of the first and second FET devices prior to the step of forming a strained layer.

19. The method of claim 15, wherein the step of removing comprises removing said thickness portion of the strained layer formed in compressive stress over the second FET device, said second FET device having N-type polarity.

20. The method of claim 15, wherein the step of removing comprises removing said thickness portion of the strained layer formed in tensile stress over the first FET device, said first FET device having P-type polarity.

21. The method of claim 15, wherein the step of removing comprises removing greater than about 10 percent of said thickness portion of the strained layer.

22. The method of claim 15, further comprising the steps of:
forming a dielectric insulating layer on the strained layer; and,
forming metal damascenes through the dielectric insulating layer to contact the source and drain regions of the respective first and second FET devices.

23. The method of claim 15, wherein the step of removing comprises the steps of:
forming a patterned resist layer exposing an area over said source and drain regions comprising one of the first and second FET devices; and,
dry etching the strained layer to remove the thickness portion.

24. The method of claim 1, wherein the strained layer consists essentially of silicon nitride.

25. The method of claim 15, wherein the strained layer is selected from the group consisting of silicon nitride and silicon oxynitride.

26. The method of claim 15, wherein the strained layer is formed having a stress level up to about 2 GPa.

27. The method of claim 1, wherein the strained layer is formed having a thickness from about 10 Angstroms to about 1000 Angstroms.

28. The method of claim 15, wherein the step of removing comprises the steps of:
forming a patterned resist layer exposing an area over said source and drain regions comprising one of the first and second FET devices; and,
dry etching the strained layer to remove a thickness portion of the strained layer over the respective source and drain regions comprising the first and second FET devices to improve charge carrier mobility.

29. The method of claim 28, further comprising the step of forming a buffer oxide layer on the first and second FET devices prior to the step of forming a strained layer.

30. The method of claim 28, further comprising the step of removing the buffer oxide layer on one of the first and second FET devices prior to the step of forming a strained layer.

31. The method of claim 28, wherein the step of removing comprises removing said thickness portion of the strained layer formed in compressive stress over the second FET device, said second FET device having N-type polarity.

32. The method of claim 28, wherein the step of removing comprises removing said thickness portion of the strained layer formed in tensile stress over the first FET device, said first FET device having P-type polarity.

33. The method of claim 28, wherein the step of removing comprises removing greater than about 10 percent of said thickness portion of the strained layer.

34. The method of claim 28, wherein the strained layer is selected from the group consisting of silicon nitride and silicon oxynitride.

35. The method of claim 28, wherein the strained layer is formed having a stress level up to about 2 GPa.

36. The method of claim 28, wherein the strained layer is formed having a thickness from about 10 Angstroms to about 1000 Angstroms.

* * * * *